United States Patent
Ono et al.

(10) Patent No.: US 8,232,189 B2
(45) Date of Patent: Jul. 31, 2012

(54) DIELECTRIC FILM MANUFACTURING METHOD

(75) Inventors: Junko Ono, Fuchu (JP); Naomu Kitano, Machida (JP); Takashi Nakagawa, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 104 days.

(21) Appl. No.: 12/974,902

(22) Filed: Dec. 21, 2010

(65) Prior Publication Data

US 2011/0156128 A1    Jun. 30, 2011

(30) Foreign Application Priority Data

Dec. 26, 2009  (JP) ................................. 2009-296528

(51) Int. Cl.
  *H01L 21/4763* (2006.01)
  *H01L 21/336* (2006.01)
  *H01L 27/108* (2006.01)
  *H01L 29/00* (2006.01)
  *H01L 29/94* (2006.01)

(52) U.S. Cl. ........ 438/593; 438/253; 257/306; 257/532; 257/E29.345

(58) Field of Classification Search .................. 438/253, 438/593; 257/306, 532, E29.345
See application file for complete search history.

(56) References Cited

U.S. PATENT DOCUMENTS

| | | | |
|---|---|---|---|
| 6,903,398 B2 * | 6/2005 | Yamamoto | 257/295 |
| 7,857,946 B2 | 12/2010 | Kitano et al. | 204/192.12 |
| 7,867,847 B2 | 1/2011 | Kitano et al. | 438/261 |
| 7,923,360 B2 | 4/2011 | Kitagawa et al. | 438/528 |
| 2008/0169520 A1 * | 7/2008 | Kiyomura et al. | 257/411 |
| 2008/0237688 A1 * | 10/2008 | Yasuda | 257/316 |
| 2009/0170341 A1 | 7/2009 | Kitano et al. | 438/770 |
| 2009/0170344 A1 | 7/2009 | Fukuchi et al. | 438/785 |
| 2010/0120238 A1 | 5/2010 | Kitano et al. | 438/586 |
| 2010/0133092 A1 | 6/2010 | Mashimo et al. | 204/192.21 |
| 2010/0221905 A1 * | 9/2010 | Hautala et al. | 438/591 |
| 2010/0244192 A1 * | 9/2010 | Nakagawa et al. | 257/532 |
| 2011/0027979 A1 | 2/2011 | Seino et al. | 438/591 |

FOREIGN PATENT DOCUMENTS

| | | | |
|---|---|---|---|
| JP | 2000-129445 A | 5/2000 | |
| JP | 2009-105087 A | 5/2009 | |

OTHER PUBLICATIONS

K. Akiyama et al., "Roles of Traps Generated in $Al_2O_3$ Film with respect to Memory Characteristics in MANOS," Extended Abstracts of the 2009 International Conference on Solid State Devices and Materials, Sendai, 2009 pp. 156-157.

* cited by examiner

*Primary Examiner* — Luan C Thai
(74) *Attorney, Agent, or Firm* — Fitzpatrick, Cella, Harper & Scinto

(57) ABSTRACT

The present invention provides a manufacturing method of a dielectric film which reduces a leak current value while suppressing the reduction of a relative permittivity, suppresses the reduction of a deposition rate caused by the reduction of a sputtering rate, and also provides excellent planar uniformity. A dielectric film manufacturing method according to an embodiment of the present invention is forms a dielectric film of a metal oxide mainly containing Al, Si, and O on a substrate, and comprises steps of forming the metal oxide having an amorphous structure in which a molar fraction between an Al element and a Si element, Si/(Si+Al), is $0<Si/(Si+Al)\leq 0.1$, and subjecting the metal oxide having the amorphous structure to annealing treatment at a temperature of 1000° C. or more to form the metal oxide including a crystalline phase.

15 Claims, 8 Drawing Sheets

AFTER ANNEALING

PROCESS 1

PROCESS 2

PROCESS 3

DIELECTRIC FILM MANUFACTURING METHOD

BACKGROUND OF THE INVENTION

1. Field of the Invention

The present invention relates to a dielectric film manufacturing method.

2. Description of the Related Art

In the development of a semiconductor device which has been making progress in higher element integration, the reduction of an operating voltage is being achieved along with the progress of element miniaturization in each element. For example, in the field of a MONOS (Metal Oxide Nitride Oxide Semiconductor) type nonvolatile semiconductor device, a blocking film, which separates a charge preserving layer (charge trap layer) and a gate electrode, is required to have a higher permittivity along with the element miniaturization. Similarly, in the field of a FG (Floating Gate) type nonvolatile semiconductor device, an insulating film between a floating electrode and a gate electrode is required to have a higher permittivity along with the element miniaturization. The charge trap layer of the MONOS type device is formed with a silicon nitride film, for example, and is required to have a high relative permittivity and also a low leak current and further required to have a large band gap against the silicon nitride film, as the blocking film. A technique utilizing $Al_2O_3$ as such a blocking film is being discussed. A method of forming the $Al_2O_3$ film includes a CVD (Chemical Vapor Deposition) method, an atomic-layer adsorption deposition method (ALD), and a sputtering method. The CVD method has an incubation time in the formation process and thus has problems of film thickness controllability, surface uniformity, and reproducibility. Meanwhile, the sputtering method has a problem of plasma damage and a problem of interface layer formation caused by oxidation of a substrate to be processed.

As a formation method of an $Al_2O_3$ film by the ALD method or the CVD method, a technique forming an $Al_2O_3$ film containing $\alpha$-$Al_2O_3$ by the use of aluminum chloride ($AlCl_3$) and oxidation gas is disclosed in Japanese Patent Application Laid-Open Publication No. 2009-105087. This technique has an advantage of obtaining a film having a large band gap of 8.8 eV.

Further, Extended Abstracts of the 2009 International Conference on Solid State Devices and Materials, 2009, pp. 156-157 describes that element reliability is improved by the use of Si-rich AlSiOx having an amorphous structure as the blocking film.

Further, as a method for forming a dielectric film having a high dielectric constant by sputtering, Japanese Patent Application Laid-Open Publication No. 2000-129445 discloses a technique utilizing crystalline metal oxide containing Al and Si as an abrasion resistant film.

In the above techniques, however, there are respective problems as follows.

In the technique of forming an $Al_2O_3$ film containing $\alpha$-$Al_2O_3$ by using oxidation gas including aluminum chloride ($AlCl_3$) and water vapor, which is disclosed by Japanese Patent Application Laid-Open Publication No. 2009-105087, an $\alpha$-$Al_2O_3$ film having a large band gap is obtained, but a gas including chloride ($AlCl_3$) as a source gas and water vapor as an oxidation gas are used, respectively, and thus there arises a problem of erosion of the inside of a semiconductor production apparatus caused by hydrogen chloride formation. Further, when a silica reaction tube is used as a component of a semiconductor production apparatus, there arises a problem that the silica reaction tube is eroded by the aluminum chloride.

The technique of utilizing Si-rich AlSiOx having an amorphous structure as the blocking film, which is disclosed in Extended Abstracts of the 2009 International Conference on Solid State Devices and Materials, 2009, pp. 156-157, can suppress a leak current via a crystal grain boundary by making the blocking film amorphous, but relative permittivity is reduced in comparison with the $Al_2O_3$ film including a crystalline phase and thus there arises a problem that it is difficult to make the blocking film thinner. Further, there is a problem that the most preferable Si content rate is not disclosed.

Further, the crystalline metal oxide containing Al and Si, which is disclosed in Japanese Patent Laid-Open No. 2000-129445, is described to be able to form the crystalline phase of $\alpha$-$Al_2O_3$ having an excellent abrasion resistance, but, although it is required, in the application to semiconductor element manufacturing, to form a uniform alumina film on a semiconductor wafer surface, a technique to solve such a problem is not disclosed in Japanese Patent Application Laid-Open Publication No. 2000-129445 and it is difficult to apply this technique to the semiconductor element manufacturing.

SUMMARY OF THE INVENTION

The present invention has been achieved for solving the above conventional problems and aims for providing a dielectric film manufacturing method which improves the above problem, reduces a leak current while suppressing the reduction of a permittivity, suppresses the reduction of a deposition rate caused by the reduction of a sputtering rate, and also forms a dielectric film having a excellent planar uniformity.

The present inventors have been diligently studied how to solve the above problems, and resultantly have found that a dielectric film having a high relative permittivity and a small leak current is obtained by forming a metal oxide having a specific composition and an amorphous structure and further by being subjected to annealing treatment, and have completed the present invention.

First aspect of the present invention is a dielectric film manufacturing method forming a dielectric film on a substrate, the dielectric film being a metal oxide mainly containing Al, Si, and O, the manufacturing method comprising the steps of: forming the metal oxide having an amorphous structure in which a molar fraction of an Al element and a Si element expressed as Si/(Si+Al) has a range of 0<Si/(Si+Al)≦0.10; and subjecting the metal oxide having the amorphous structure to annealing treatment to form the metal oxide including a crystalline phase.

Second aspect of the present invention is a computer-readable recording medium recording a program for causing a computer to execute a formation method of a semiconductor element which includes a dielectric film having a high permittivity wherein the formation method is a dielectric film manufacturing method forming a dielectric film on a substrate, the dielectric film being a metal oxide mainly containing Al, Si, and O, and the formation method comprising: a first step of forming the metal oxide having an amorphous structure in which a molar fraction of an Al element and a Si element expressed as Si/(Si+Al) has a range of 0<Si/(Si+Al)≦0.10; and a second step of subjecting the metal oxide having the amorphous structure to annealing treatment to form the metal oxide including a crystalline phase.

Third aspect of the present invention is a MIS capacitor in which a dielectric film and an upper electrode are deposited on a substrate having an oxide film on a surface thereof, wherein the dielectric film is a metal oxide which mainly contains Al, Si, and O and includes a crystalline phase, and a molar fraction of an Al element and a Si element expressed as Si/(Si+Al) has a range of 0<Si/(Si+Al)≦0.10.

Fourth aspect of the present invention is a MONOS type nonvolatile memory element in which a source-drain region, a first insulating film, a second insulating film, a third insulating film, and a gate electrode are sequentially laminated on a substrate surface subjected to element isolation, wherein the third insulating film is a metal oxide which mainly contains Al, Si, and O and includes a crystalline phase, and a molar fraction of an Al element and a Si element expressed as Si/(Si+Al) has a range of 0<Si/(Si+Al)≦0.10.

Fifth aspect of the present invention is a nonvolatile semiconductor device provided with a source electrode, a drain electrode, a substrate, at least a part of the surface of which is a semiconductor layer, a gate electrode formed on a region between the source electrode and the drain electrode in the substrate, and a lamination type gate insulating film provided between the substrate and the gate electrode, wherein at least one layer of gate insulating films included in the lamination type insulating film is a blocking insulating film, and the blocking insulating film is a metal oxide which mainly contains Al, Si, and O and includes a crystalline phase, and a molar fraction of an Al element and a Si element expressed as Si/(Si+Al) has a range of 0<Si/(Si+Al)≦0.10.

According to the present invention, it is possible to realize the reduction of a leak current without causing the reduction, or by suppressing the reduction, in a relative permittivity of a dielectric film made of metal oxide containing Al. Accordingly, even when the dielectric film manufacturing method in the present invention is applied to a manufacturing method of a blocking insulating film in a MONOS type nonvolatile semiconductor element and a manufacturing method of an insulating film between a floating electrode and a gate electrode in a FG type nonvolatile semiconductor element, it is also possible to reduce an equivalent oxide thickness (EOT).

DETAILED DESCRIPTION OF THE INVENTION

Hereinafter, an embodiment of the present invention will be explained in detail according to the drawings.

An dielectric film formed by a manufacturing method according to an embodiment of the present invention will be explained for the case of a MIS (Metal Insulator Semiconductor) capacitor in which a composite oxide film containing Al and Si as constituting elements (hereinafter, denoted by AlSiO film) is formed as an dielectric film on a silicone substrate which has a silicon oxide film on the surface.

Figure 1:
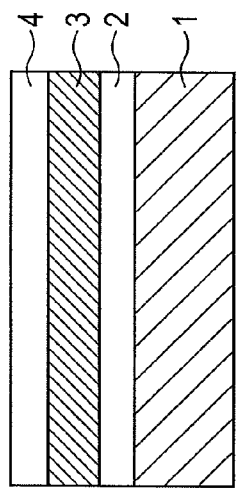
FIG. 1 is a cross-sectional view of a MIS capacitor in which a dielectric film is formed according to an embodiment of the present invention.

A method of forming a dielectric film according to the present embodiment deposits an AlSiO film 3 having an amorphous structure as a dielectric film on a silicon substrate 1 which has a silicon oxide film 2 having a thickness of 3.5 nm on the surface, and deposits a TiN film 4 as an upper electrode film on the AlSiO film 3, as shown in FIG. 1.

Figure 2:
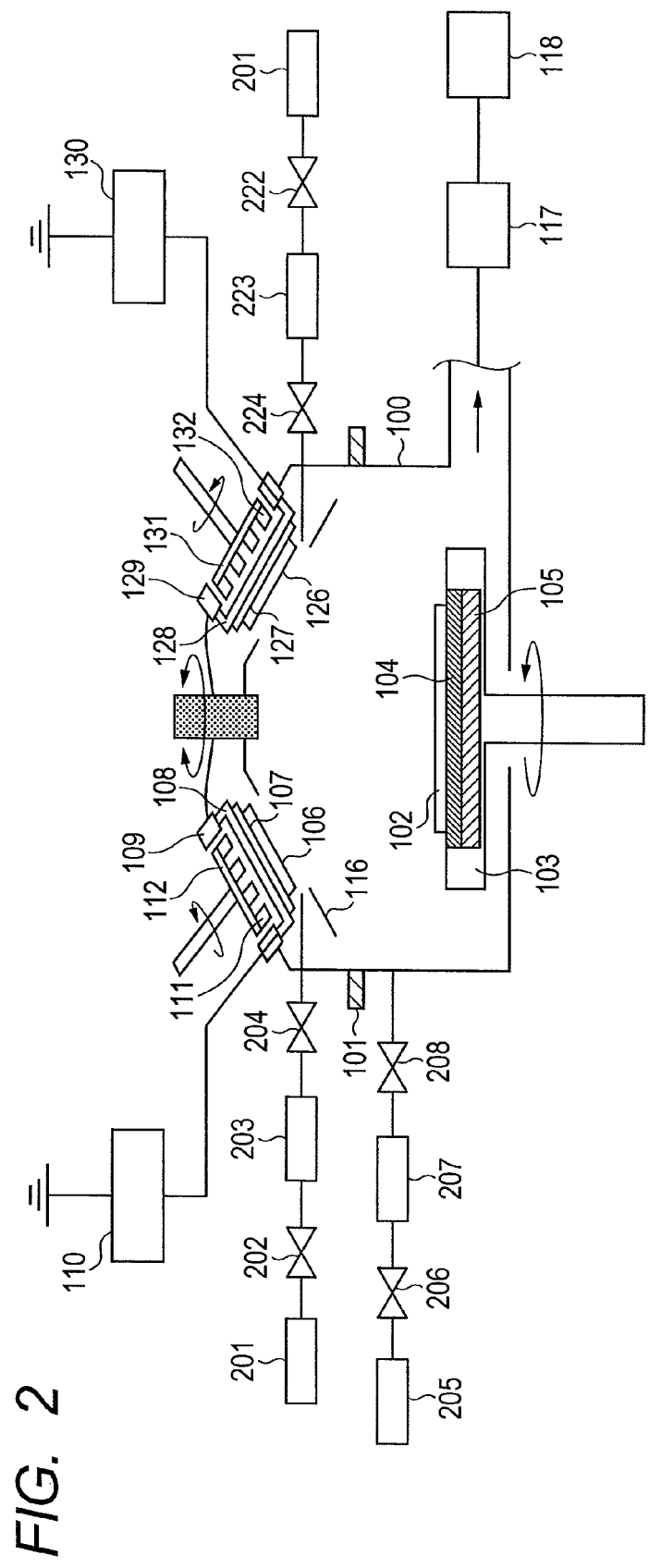
FIG. 2 is a diagram showing an outline of a treatment apparatus used for a formation process of a metal oxide film having an amorphous structure according to an embodiment of the present invention.

FIG. 2 shows an outline of an example of a treatment apparatus used for a formation process of an AlSiO film having an amorphous structure.

A film-forming treatment chamber 100 is configured so as to be able to be heated to a predetermined temperature by a heater 101. A film-forming treatment chamber 100 is configured so as to be heated to a prescribed temperature by a heater 101. Further, the film-forming treatment chamber 100 is constituted so that a heater 105 can heat a substrate to be processed 102 to a prescribed temperature via a susceptor 104 built in a substrate support 103. The substrate support 103 can preferably rotate in a prescribed rotation number from the standpoint of the evenness of film thickness. In the film-forming treatment chamber 100, targets 106 and 126 are disposed at positions facing the substrate to be processed 102.

Targets 106 and 126 are disposed on target holders 108 and 128 via back plates 107 and 127, respectively, made of metal such as copper. Meanwhile, the external shape of a target assembly formed by combining targets 106 and 126 with back plates 107 and 127 may be formed with a target material as one part and attached as the target. That is, a structure in which the target is disposed on the target holder is acceptable.

Target holders 108 and 128 made of metal such as copper are connected with direct-current power sources 110 and 130 for applying sputtering discharge power, and are insulated from the wall of the film-forming treatment chamber 100 at the ground potential by insulators 109 and 129, respectively.

Behind the targets 106 and 126 each seen from the sputtering plane, respective magnets 111 and 131 for realizing magnetron sputtering are disposed. Respective magnets 111 and 131 are held by magnet holders 112 and 132, and are configured so as to be rotatable by a magnet holder rotation mechanism (not shown). In order to make the erosion of the target uniform, magnets 111 and 131 are rotated during the discharge.

Targets 106 and 126 are disposed at off-set positions obliquely above the substrate to be processed 102. That is, each central point of the sputtering planes of targets 106 and 126 are located at a position shifted in a prescribed dimension relative to the normal line of the central point of the substrate 102.

Between targets 106 and 126 and the substrate to be processed 102, a shielding plate 116 is disposed to control the film-forming on the substrate to be processed 102 by sputtered particles ejected from targets 106 and 126 to which electric power is applied.

In the present embodiment, as the target, a metal target 106 of Al and a metal target 126 of Si are used. The deposition of the dielectric film 3 is performed by applying power to metal targets 106 and 126 from direct-current power sources 110 and 130 via target holders 108 and 128 and back plates 107 and 127, respectively. At this time, inert gas is introduced into the treatment chamber 100 from an inert gas source 201 to the treatment chamber 100 at the vicinity of the targets via valves 202 and 222, mass flow controllers 203 and 223, valves 204 and 224, respectively. Further, a reactive gas being oxygen is introduced into the treatment chamber 100 at the vicinity of the substrate from an oxygen gas source 205 via a valve 206, a mass flow controller 207, and a valve 208. The introduced inert gas and reactive gas are exhausted by a vacuum pump 118 via a conductance valve 117.

For example, the present embodiment carries out control of the heater 105 to cause the substrate to be heated to 30° C., sets a target power of the Al target 106 to 600 W, sets a target power of the Si target 126 in a range of 0 W to 500 W, uses Ar as the inert gas, sets a supply quantity of Ar to 25 sccm, and carries out film-forming at a supply quantity of oxygen of the reactive gas in a range of 0 sccm to 20 sccm (standard cubic centimeter per minute). Here, 1 sccm corresponds to a gas flow which is supplied in 1 minute and expressed in $cm^3$ at 0° C. and 1 Pa, that is, $1.69×10^{-3}$ Pa $m^3$/s (at 0° C.).

At this time, a molar fraction Si/(Si+Al) of an AlSiO film which is a metal oxide mainly containing Al and Si is adjusted by the power supplied to the Si target 126.

Figure 13:
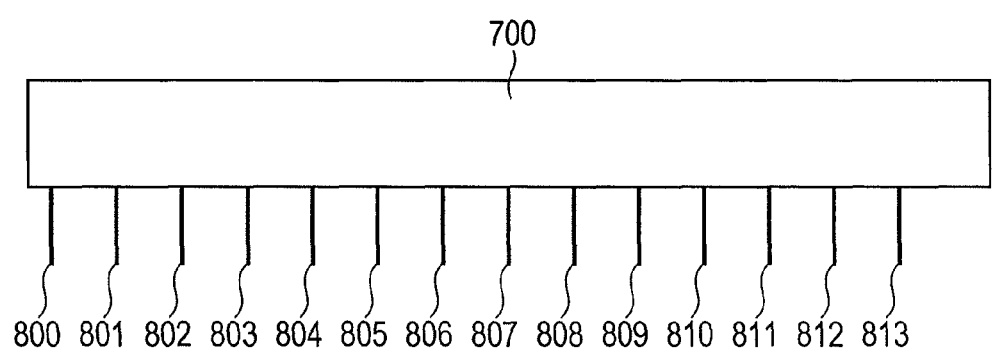
FIG. 13 is a diagram showing a control mechanism in an embodiment of the present invention.

FIG. 13 is a diagram showing a control mechanism in an embodiment of the present invention. Open-close control of the valves 202, 204, 206, 208, 222, and 224 can be performed by a control unit 700 via control input/output ports 800, 801, 802, 803, 804, and 805, respectively. Further, flow rate adjustment in the mass flow controllers 203, 207, and 223 can be performed by the control unit 700 via control input/output ports 806, 807, and 808, respectively. Further, aperture adjustment of the conductance valve 117 can be performed by the control unit 700 via a control input/output port 809. Moreover, the temperature adjustment of the heater 101 can also be performed by the control unit 700 via an input/output port 810. Furthermore, regarding a rotation state of the substrate holder 103, the rotation speed can be adjusted by the control unit 700 via an input/output port 811. Further, regarding the DC power supplies 110 and 130, supply powers can be adjusted by the control unit 700 via input/output ports 812 and 813, respectively.

Figure 14:
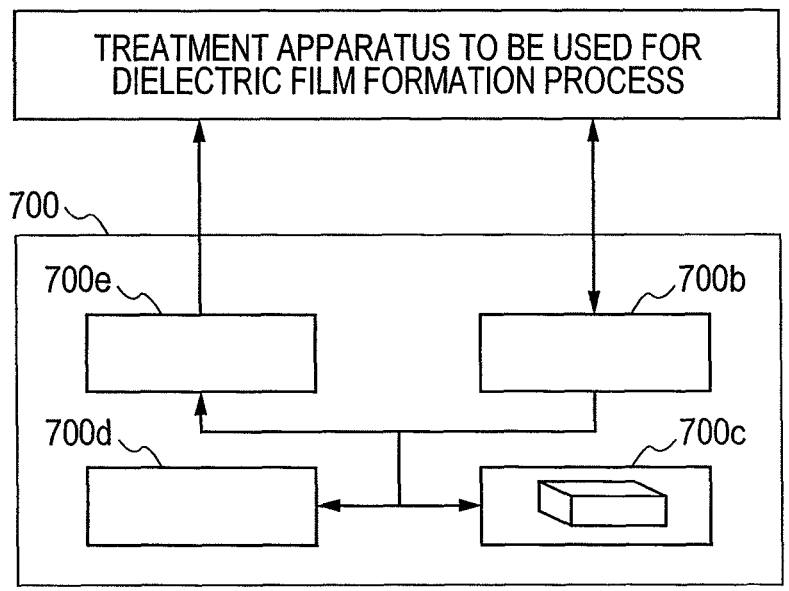
FIG. 14 is an exemplary diagram of a control mechanism provided in a treatment apparatus according to an embodiment of the present invention.

FIG. 14 is an exemplary diagram of the control unit 700 provided so as to control a film-forming apparatus 100 according to an embodiment of the present invention. The control unit 700 is provided with an input unit 700b, a storage unit 700c storing a program and data, a processor 700d, and an output unit 700e and basically has a computer configuration to control the corresponding film-forming apparatus 100. Note that the control unit 700 may be provided separately from the film-forming apparatus 100 or may be included in the film-forming apparatus 100. A processing method of storing in a storage medium a program which causes a configuration of the embodiment operate so as to realize a function of the embodiment, reading out the program stored in the storage medium as a code, and executing the program in a computer falls within a scope of the above embodiment. That is, the computer-readable storage medium also falls within the scope of the embodiment. Further, not only the storage medium storing the computer program but also the computer program itself is included in the above embodiment. Such a storage medium which can be used includes, for example, a floppy (registered trade mark) disk, a hard disk, an optical disk, a magneto-optical disk, a CD-ROM, a magnetic tape, a nonvolatile memory card, and a ROM.

Figure 3:
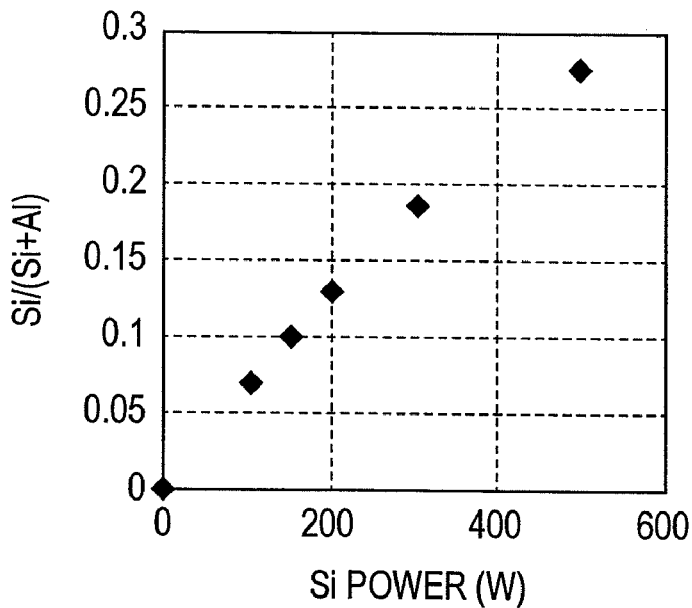
FIG. 3 is a diagram showing a Si-target power dependence of a molar fraction Si/(Si+Al) in an AlSiO film according to an embodiment of the present invention.

FIG. 3 shows a Si-target power dependence of the molar fraction Si/(Si+Al) of an AlSiO film. In FIG. 3, the horizontal axis shows a Si target power (power supplied to the Si target 126) and the vertical axis shows a Si molar fraction relative to (Si+Al). Here, in FIG. 3, Al target power (power supplied to the target 106) is set to be constant at 600 W. The composition may be evaluated by analysis by using XPS (X-ray Photoelectron Spectroscopy). In this manner, it is confirmed that the molar fraction Si/(Si+Al) can be controlled in a range of 0 to 0.30 by adjusting the Si target power. Accordingly, in the present embodiment, the control unit 700 can control the molar fraction Si/(Si+Al) of the AlSiO film by adjusting the power supplied to the target 126 through the control of the DC power supply 130.

In the above formation process, an AlSiO film and an $Al_2O_3$ film without containing Si or a $Al_2O_3$ film without containing Si is deposited in a film thickness range of 5 nm to 25 nm.

Next, the deposited AlSiO film and the $Al_2O_3$ film are crystallized by annealing treatment at a temperature in a range of 600° C. to 1000° C. in a nitrogen atmosphere and formed as the dielectric film 3 which is a metal oxide film containing a crystalline phase.

Next, a TiN film 4 is deposited on the dielectric film 3 at a film thickness of 10 nm by a sputtering method. Note that the dielectric film 3 may be subjected to the annealing treatment to be crystallized after the deposition of the TiN film 4.

Next, the TiN film 4 is processed into a desired size by using a lithography technique and an RIE (Reactive Ion Etching) technique, and a MIS capacitor structure is formed. Here, electric characteristics were evaluated by the use of the silicon substrate 1 as a lower electrode and the TiN film 4 as an upper electrode.

Figure 4:
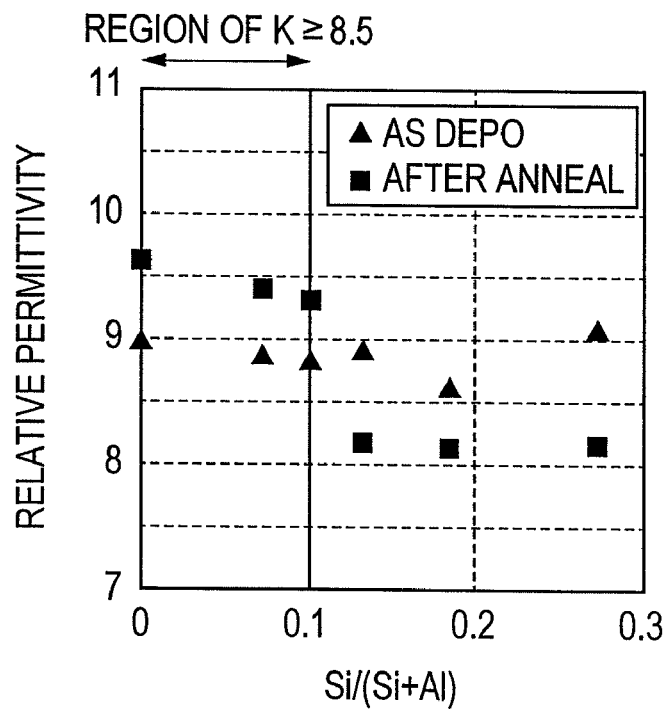
FIG. 4 is a diagram showing a relationship between a relative permittivity and a molar fraction Si/(Si+Al) in an element fabricated by an embodiment of the present invention.

FIG. 4 shows a relationship between a relative permittivity and the molar fraction Si/(Si+Al) in the fabricated element. In FIG. 4, the horizontal axis shows a Si molar fraction relative to (Si+Al) and the vertical axis shows a relative permittivity of the $Al_2O_3$ film, in the dielectric film 3 of the fabricated element. In the drawing, the plot of black triangles ▲ shows a result of an as-depo film and the plot of black rectangle ■ shows a result of the film after the annealing at 1000° C. Here, "as-depo film" is an abbreviation of "as-deposited film" and the as-depo film means a condition of forming the dielectric film 3. In the drawing, even when the molar fraction in the as-depo film is changed, the relative permittivity of the as-depo film is found not to change largely and shows almost a constant value of about 9. On the other hand, the result after the annealing at 1000° C. shows that the relative permittivity of the AlSiO film increases compared with that of the as-depo film and becomes 9.3 to 9.6 in a molar fraction Si/(Si+Al) range of 0 to 0.10, but the relative permittivity decreases considerably down to 8.2 and becomes smaller than that of the as-depo film when the molar fraction of Si is increased to more than 0.1.

Figure 5:
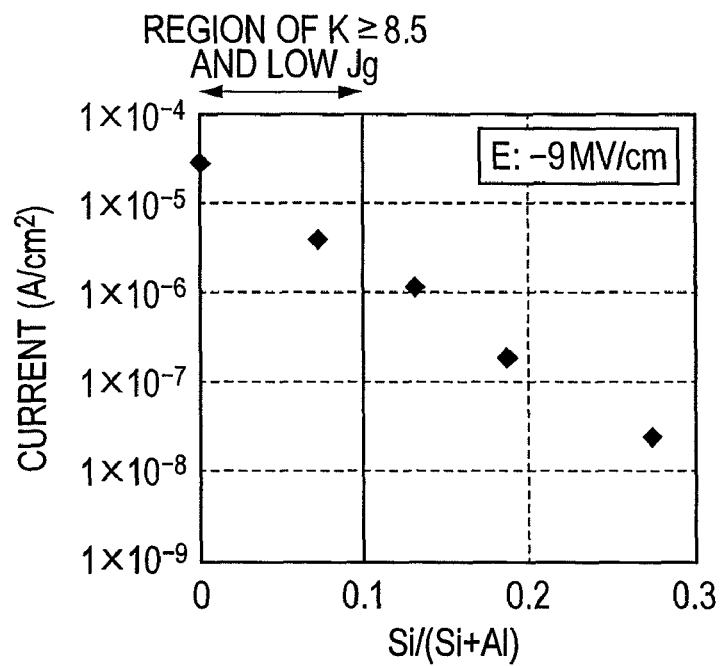
FIG. 5 is a diagram showing a relationship between a leak current and a molar fraction Si/(Si+Al) in an element fabricated by an embodiment of the present invention.

FIG. 5 shows a relationship between a leak current of the fabricated element and a molar fraction Si/(Si+Al) in the dielectric film 3 of the fabricated element. The element used here was subjected to annealing treatment at 1000° C. In the drawing, the horizontal axis shows a molar fraction Si/(Si+Al) and the vertical axis shows a leak current when an electric field of −9 MV/cm is applied to the upper electrode 4 of the element shown in FIG. 1. The leak current was evaluated by voltage-current measurement. FIG. 5 shows that the leak current decreases as the Si molar fraction is increased.

In particular, while the $Al_2O_3$ film without containing Si (in FIG. 5, Si/(Si+Al)=0) has a leak current of $2.7 \times 10^{-5}$ A/cm$^2$, the leak current decreases to $2.45 \times 10^{-8}$ A/cm$^2$ by approximately three digits when the molar fraction is set to 0.3. Here, a molar fraction providing a relative permittivity k of 8.5 or more is found to be from 0 to 0.1 from FIG. 4. Accordingly, it is shown that a molar fraction Si/(Si+Al) which provides a relative permittivity k of 8.5 or more and also can suppress the leak current value exists in a range larger than 0 and a range of 0.10 or less.

Figure 6:
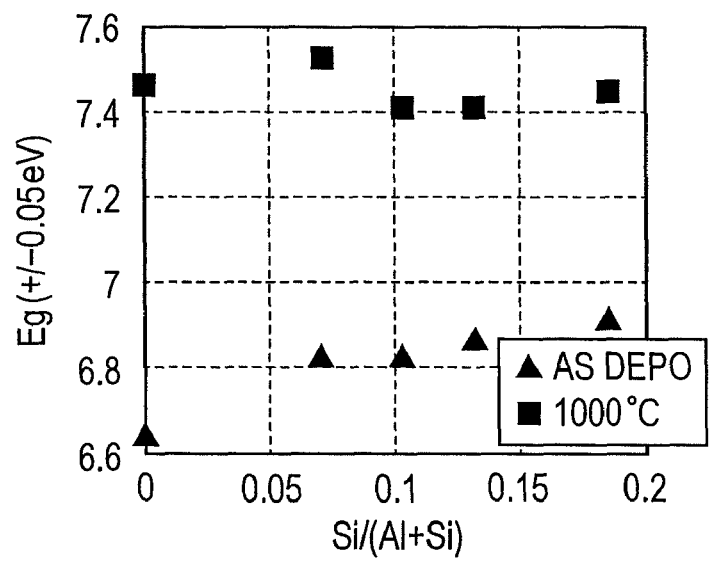
FIG. 6 is a diagram showing a relationship between a band gap and a molar fraction Si/(Si+Al) in an element fabricated by an embodiment of the present invention.

FIG. 6 shows a relationship between a band gap (Eg) of the fabricated element and a molar fraction Si/(Si+Al) in the dielectric film of the fabricated element. The Eg was measured by vacuum ultraviolet spectroscopic ellipsometry (VUV-SE). In the drawing, the plot of black triangles ▲ and the plots of rectangles ■ show results of as-depo film and the film after annealing at 1000° C., respectively. The drawing shows that the band gap of the as-depo film increases as the molar fraction Si/(Si+Al) is increased and the band gap increases from 6.65 eV to 6.93 eV in a molar fraction Si/(Si+Al) range from 0 to 0.2. On the other hand, the band gap of the film after annealing at 1000° C. increases to 7.53 eV at a molar fraction Si/(Si+Al) of 0.07 but the band gap decreases as the molar fraction Si/(Si+Al) is increased after that and becomes 7.45 eV which is approximately the same level as that of the $Al_2O_3$ film without Si introduction (in FIG. 6, case of Si/(Si+Al)=0).

Form the above results, the molar fraction Si/(Si+Al) of the AlSiO film is required to be in a range larger than 0 and a range of 0.1 or less where a leak current reduction effect is obtained while the reduction of the relative permittivity is being suppressed, and the molar fraction is preferably in a range of larger than 0 and a range of 0.08 or less where an increase effect of a band gap can be obtained, and more preferably in a range larger than 0 and a range of 0.07 or less.

Figure 7:
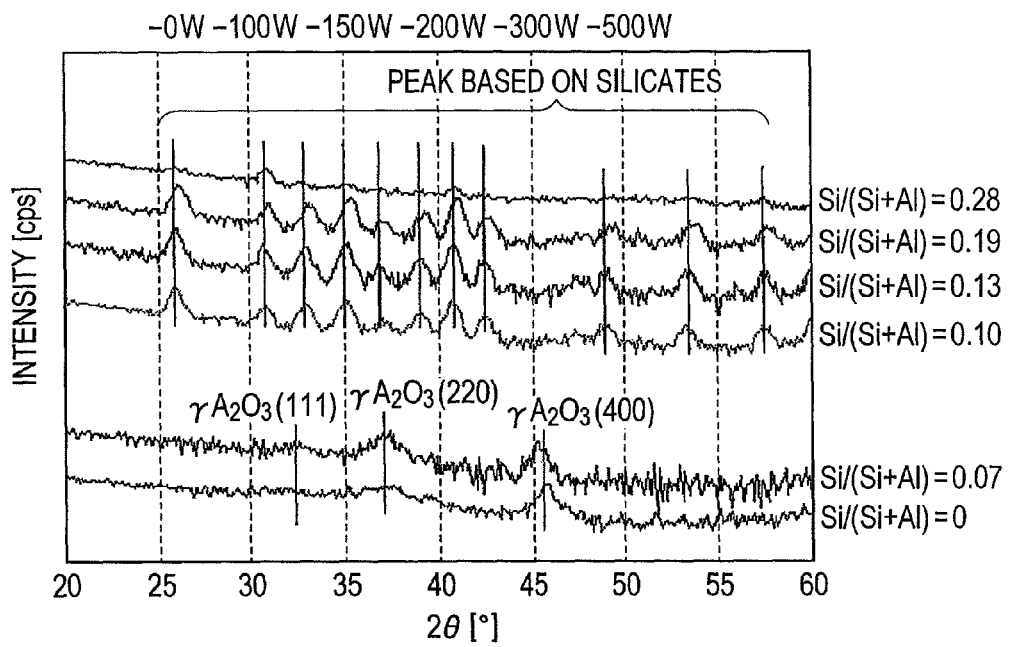
FIG. 7 is a diagram showing an XRD spectrum according to an embodiment of the present invention.

FIG. 7 shows X-ray diffraction patterns of the $Al_2O_3$ film (in FIG. 7, case of Si/(Si+Al)=0) and the AlSiO film after annealing at 1000° C. It is found from FIG. 7 that the $Al_2O_3$ film and the AlSiO film are crystallized by the annealing at 1000° C., and a film having a molar fraction Si/(Si+Al) of 0 and 0.07 has a crystalline structure of γ-$Al_2O_3$, a film having a molar fraction Si/(Si+Al) of 0.1 has a mixed crystalline structure of γ-$Al_2O_3$ and aluminum silicate, and a film having an molar fraction Si/(Si+Al) increased from 0.1 has a crystalline structure of aluminum silicate. This difference in the crystalline structure is considered to contribute to the change of the relative permittivity value and the suppression of the leak current. That is, it is possible to reduce the formation of the aluminum silicate in the crystalline structure of the dielectric film 3 after annealing by setting the molar fraction Si/(Si+Al) to be 0.1 at largest.

Figure 8:
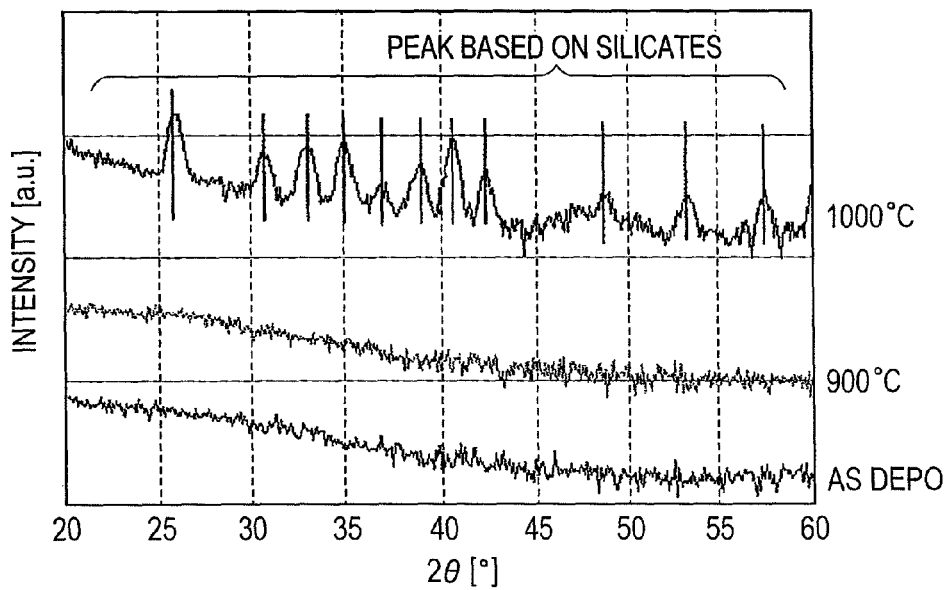
FIG. 8 is a diagram showing an annealing temperature dependence of an X-ray diffraction spectrum in an AlSiO film having a molar fraction Si/(Si+Al) of 0.1 according to an embodiment of the present invention.

FIG. 8 shows an annealing temperature dependence of an X-ray diffraction spectrum in the AlSiO film having a molar fraction Si/(Si+Al) of 0.1. In FIG. 8, 2θ of the horizontal axis shows an angle when an X-ray is input in an angle of θ against the horizontal direction of a sample and an X-ray is detected in a direction having an angle of 2θ against the incident X-ray among X-rays reflected from the sample, and "intensity" of the vertical axis shows an intensity (arbitrary value) of the diffracted X-ray from the sample. From FIG. 8, it can be confirmed that the AlSiO film has an amorphous structure in a range of an as-deposited state to a state annealed at a temperature of 900° C. On the other hand, at an annealing temperature of 1000° C. or more, the film can be confirmed to be crystallized. Accordingly, it is shown to be required to set the annealing treatment temperature to be 1000° C. or more for obtaining the advantage of the dielectric film in the present invention.

Figure 9A:
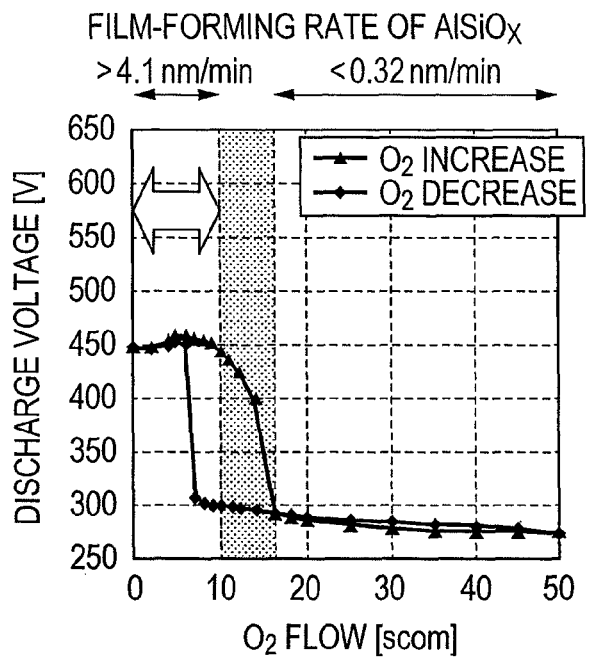
FIG. 9A is a diagram showing oxygen flow rate dependences of discharge characteristics of an Al target and a deposition rate of an AlSiO film according to an embodiment of the present invention.
Figure 9B:
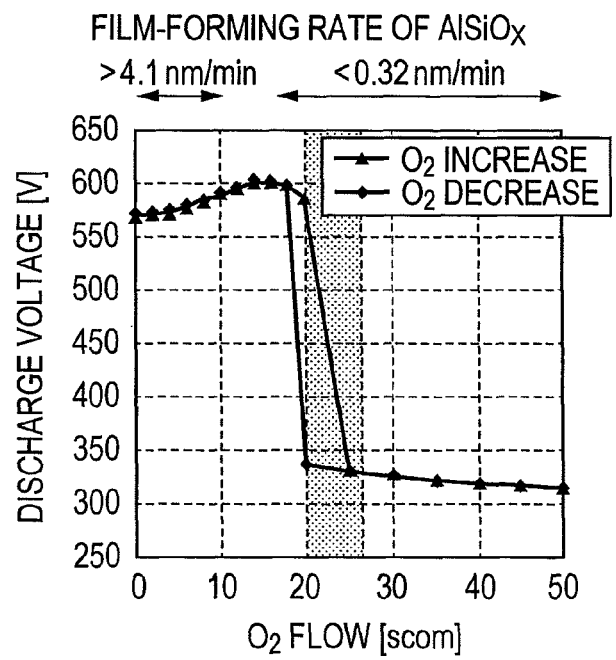
FIG. 9B is a diagram showing oxygen flow rate dependences of discharge characteristics of a Si target and a deposition rate of an AlSiO film according to an embodiment of the present invention.

Next, FIGS. 9A and 9B show oxygen flow rate dependences of discharge characteristics of the Al target and the Si target, respectively, together with an oxygen flow rate dependence of a deposition rate for the AlSiO film. In FIGS. 9A and 9B, the plot of black triangles ▲ shows a case of increasing the oxygen flow rate and the plots of black rectangles ♦ and black circles ● show a case of reducing the oxygen flow rate. From the discharge characteristics of the Al target shown in FIG. 9A, it can be confirmed that a discharge voltage is 450 V or more in an oxygen flow rate range of 10 sccm or less but the discharge voltage decreases to 300 V or lower in a range more than 15 sccm. Further, from the discharge characteristics of the Si target shown in 9B, it can be confirmed that the discharge voltage is equal to 550 V or more in an oxygen flow rate range of 20 sccm or less but the discharge voltage decreases to 330 V or less at in a range of 25 sccm or more. These discharge voltage changes are caused by the phenomenon that the surface of the metal target is oxidized when the oxygen supply quantity is increased and the discharge current is increased by the increase of a secondary electron emission coefficient and the reduction of ionization energy of the gas. Here, "sputtering rate" means the number of sputtering atoms emitted by one impact ion providing an impact to a sputtering target. That is, the surface of the metal target is oxidized as the oxygen flow rate is increased and it becomes difficult to sputter a sputtering particle of a metal element which is to be sputtered normally, resulting in the reduction of the sputtering rate. As described above, the oxidation of the metal target surface and the change of the discharge voltage are correlated with each other and thus a flow rate providing the maximum lowering rate of the discharge voltage coincides with a flow rate providing the maximum lowering rate of the sputtering rate.

Meanwhile, the deposition rate of the AlSiO film is equal to 0.32 nm/min or lower in an oxygen flow rate range of 15 sccm or more but increases considerably to 4.1 nm/min or more in an oxygen flow rate range less than 10 sccm. This change of the deposition rate depends on the discharge characteristics of the Al target and caused by the situation that an Al density is sufficiently more than a Si density in the AlSiO film of the present invention. That is, as apparent from the above, it is preferable to perform the formation of the dielectric film in an embodiment of the present invention at 10 sccm or less where oxidation of the Al target is at least small and a deposition can be realized without causing the reduction of the deposition rate.

In this manner, in the graph showing an oxygen flow rate dependency of the discharge voltage, the deposition rate also decreases across a boundary of a region where the discharge voltage changes discontinuously (region where the discharge voltage decreases dramatically) when the oxygen supply quantity is increased. Since the reduction of the deposition rate means the lowering of the sputtering rate, an oxygen supply quantity which provides the dramatic reduction of the discharge voltage as mentioned above can be said to be an oxygen supply quantity which provides the maximum lowering rate of the sputtering rate caused by the oxidation of the metal target surface by the oxygen supplied.

Accordingly, when the metal target is Al, for example, as apparent from FIG. 9A, it is possible to improve the deposition rate by setting the oxygen supply quantity to be equal to or less than an oxygen supply quantity which provides the maximum lowering rate of the sputtering rate caused by the oxidation of the Al target surface, in the variation of the sputtering rate (variation of the discharge voltage) in the Al target (i.e., in the oxygen supply quantity dependence of the sputtering rate (discharge voltage)) when the oxygen supply quantity is increased. In this manner, it is preferable to set the oxygen supply quantity for the Al target to be equal to or less than 10 sccm for suppressing the reduction of the sputtering rate in the Al target.

Further, when the metal target is Si, for example, as apparent from FIG. 9B, it is possible to improve the deposition rate by setting the oxygen supply quantity to be equal to or less than an oxygen supply quantity which provides the maximum lowering rate of the sputtering rate caused by the oxidation of the Si target surface in the variation of the sputtering rate in the Si target when the oxygen supply quantity is increased. In this manner, it is preferable to set the oxygen supply rate for the Si target to be equal to or less than 20 sccm for suppressing the reduction of the sputtering rate in the Si target.

Further, as described above, for improving the film-forming rate of the AlSiO film, as apparent from FIGS. 9A and 9B, it is preferable to set the oxygen supply quantity to be equal to or less than 10 sccm which corresponds to the case in which the discharge voltages does not dramatically decrease, that is, the case in which the sputtering rate does not dramatically decrease, for both of the Al target and the Si target.

Next, a relationship was studied between planar uniformity of the thickness in the formed dielectric film and a pressure within the vacuum container during film-forming. From the result, it was confirmed that uniformity of ±2.5% or less was able to be obtained at a pressure within the vacuum container in a range of $1\times10^{-1}$ Pa or less. Note that, when the pressure within the vacuum container is increased to a pressure equal to or higher than $1\times10^{-1}$ Pa, the energy of the sputtering particle decreases when the sputtering particle arrives at the substrate and this is considered to be a factor causing a uniformity reduction.

From the above, for producing a dielectric film having a relative permittivity of 8.5 or more and also a low leak current value, in the formation of a dielectric film made of a metal oxide mainly containing Al, Si, and O, it is necessary to form a metal oxide having an amorphous structure and a molar fraction of an Al element and a Si element, Si/(Si+Al), set as $0<(Si/(Si+Al))\leq0.1$ and further to perform annealing treatment at a temperature of 1000° C. or more and convert the metal oxide having the amorphous structure into a dielectric film including a crystalline phase mainly containing $\gamma$-$Al_2O_3$.

For producing a dielectric film having a band gap equal to 7.45 eV or more, in the formation of a dielectric film made of a metal oxide mainly containing Al Si, and O, it is necessary to form a metal oxide having an amorphous structure and a molar fraction of an Al element and a Si element, Si/(Si+Al), set as $0<(Si/(Si+Al))\leq0.08$ and further to perform annealing treatment at a temperature of 1000° C. or higher and convert the metal oxide having the amorphous structure into a dielectric film including a crystalline phase mainly containing $\gamma$-$Al_2O_3$.

Further, the process forming the metal oxide having an amorphous structure is preferably a process performing magnetron sputtering of a metal target which is made of a metal material contained in the metal oxynitride layer under a mixed atmosphere of a reactive gas containing a mixed gas of oxygen and nitrogen and an inert gas, in a vacuum container. In this process, for suppressing the reduction of the deposition rate, it is preferable to set the supply quantity of the reactive gas to be equal to or less than a supply quantity which provides the maximum lowering rate of the sputtering rate caused by the oxidation of the metal target surface. Further, it is preferable to set the pressure within the vacuum container during film-forming to be $1\times10^{-1}$ Pa or less for making the film thickness uniformity of the dielectric film to be formed to be ±2.5% or less.

Note that, while the above explanation has been made for a case in which a dielectric film is formed on a silicon oxide film, the present invention is not limited to this case and the present invention can be applied to a blocking film in a MONOS type nonvolatile memory, an insulating film between a floating electrode and a gate electrode in a FG type nonvolatile memory, and a part of a MOS transistor, and the advantage of the present invention can be obtained sufficiently well in these applications.

That is, the method of the present invention can be applied to a manufacturing method of a semiconductor device having a dielectric film as an insulating film and the manufacturing method includes the following manufacturing method, for example.

A manufacturing method to which the manufacturing method of the present invention can be applied includes a manufacturing method of a nonvolatile semiconductor device, for example, having a substrate whose at least a part of the surface is a semiconductor layer, a gate electrode formed on the substrate, and a lamination type gate insulating film in which insulating films are sequentially laminated between the substrate and the gate electrode, and the manufacturing method that forms at least one layer of the insulating films included in the lamination type gate insulating film by the method according to an embodiment of the present invention.

Further, a semiconductor device manufactured by the manufacturing method of the present invention includes a nonvolatile semiconductor device, for example, having a substrate whose at least a part of the surface is a semiconductor layer, a gate electrode formed on the substrate, and a structure in which an insulating film, a floating electrode, and an insulating film are sequentially laminated between the substrate and the gate electrode, and the semiconductor device has the dielectric film of the present invention as at least a part of the insulating film located between the gate electrode and the floating gate.

FIRST EXAMPLE

A first example will be explained in detail with reference to the drawing.

Figure 10:
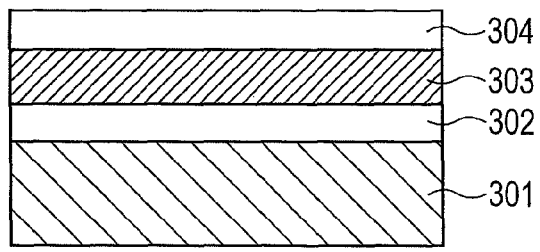
FIG. 10 is a cross-sectional view of a MIS capacitor in a first example of the present invention.

FIG. 10 is a diagram showing a MIS capacitor having a dielectric film formed by a manufacturing method according to an embodiment of the present invention. An AlSiO film having an amorphous structure was deposited by a sputtering method on a silicon substrate 301 which has a silicon oxide film 302 having a thickness of 3.5 nm on the surface. Metal targets of Al and Si were used as the targets and argon, oxygen, and nitrogen were used as the sputtering gas.

A deposition condition can be optionally determined in a substrate temperature range of 27° C. to 600° C., a target power range of 50 W to 1000 W, a sputtering gas pressure range of 0.02 to 0.1 Pa, an Ar gas flow rate range of 1 sccm to 200 sccm, an oxygen gas flow rate range of 1 sccm to 100 sccm, and a nitrogen gas flow rate range of 1 sccm to 50 sccm.

Here, the film-forming was carried out in the following condition; a substrate temperature of 30° C., an Al target power of 600 W, a Si target power of 50 W to 500 W, a sputtering gas pressure of 0.03 Pa, and an Ar flow rate of 25 sccm. Further, the oxygen supply quantity was determined to be in the range shown in FIG. 9A so as not to cause the reduction of the deposition rate.

An AlSiO film 303 was deposited by using the above described formation process at a Si molar fraction in a range of $0 \leq Si/(Si+Al) \leq 0.30$ to have a film thickness in a range of 5 nm to 25 nm.

Next, a TiN film 304 having a film thickness of 10 nm was deposited on the AlSiO film by a sputtering method. A Ti metal target was used for the target and an argon gas was used as the sputtering gas.

A deposition condition can be optionally determined in a substrate temperature range of 27° C. to 600° C., a target power range of 50 W to 1000 W, a sputtering gas pressure range of 0.02 Pa to 0.1 Pa, an Ar gas flow rate range of 1 sccm to 200 sccm, and a nitrogen gas flow rate range of 1 sccm to 50 sccm.

Here, the film-forming was carried out in the following condition; a substrate temperature of 30° C., a Ti target power of 750 W, a sputtering gas pressure of 0.03 Pa, an Ar gas flow rate of 30 sccm, and a nitrogen gas flow rate of 10 sccm.

Note that while the TiN film 304 was deposited here, it is possible to optionally use Ti, TaN, W, Pt, Ru, Al, TiAlN and Si.

Next, annealing treatment was carried out for 2 min at a temperature of 1000° C. in a nitrogen atmosphere, and the AlSiO film was crystallized to form the dielectric film 303. Note that, while the TiN film 304 was deposited and then the annealing treatment was carried out, the annealing treatment may be carried out before the deposition of the TiN film 304. Further, while the annealing treatment was carried out in the nitrogen atmosphere, oxygen and inert gas such as argon can be used. The annealing treatment also may be carried out in an atmosphere selected from a group including these gasses.

Next, the TiN film 304 was processed into a desired size by a lithograph technique and an RIE technique and a MIS capacitor structure was formed.

The relative permittivity of the dielectric film 304 fabricated in the above manner was measured. Form the result, it was confirmed that a relative permittivity of 8.5 or more was obtained and the leak current was ale to be reduced at a Si molar fraction Si/(Si+Al) of the AlSiO film in a range of 0.1 o less. Further, it was confirmed that the band gap increased at a Si molar fraction Si/(Si+Al) of the AlSiO film in a range of 0.08 or less.

In this manner, it was confirmed that a dielectric film having a relative permittivity of 8.5 or higher and a reduced leak current could be obtained in the present example, by a process of forming a metal oxide which is denoted by AlSiO (Si molar fraction: 0<Si/(Si+Al) 0.1) and has an amorphous structure and by a process of providing the metal oxide having the amorphous structure with annealing treatment at a temperature of 1000° C. or higher to form a metal oxide including a crystalline phase.

Further, it was confirmed that the same effect was obtained also even when one material selected from a group including Ti, TaN, w, Pt, Ru, Al, and Si was used in place of the TiN film 304.

SECOND EXAMPLE

Figure 11:
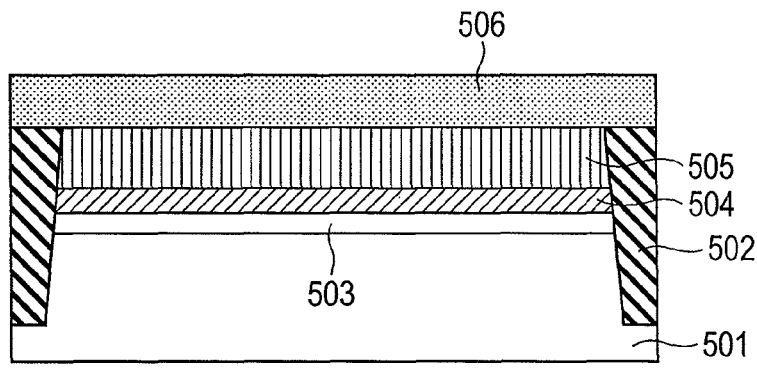
FIG. 11 is a diagram showing a process of a semiconductor device manufacturing method in a second example of the present invention.
Figure 11:
Figure 11:
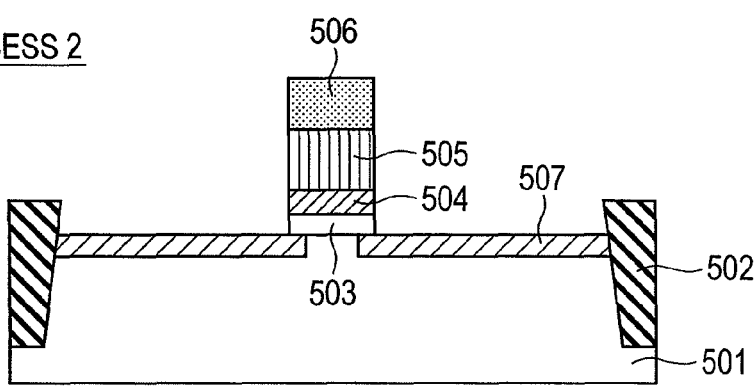
Figure 11:
Figure 11:
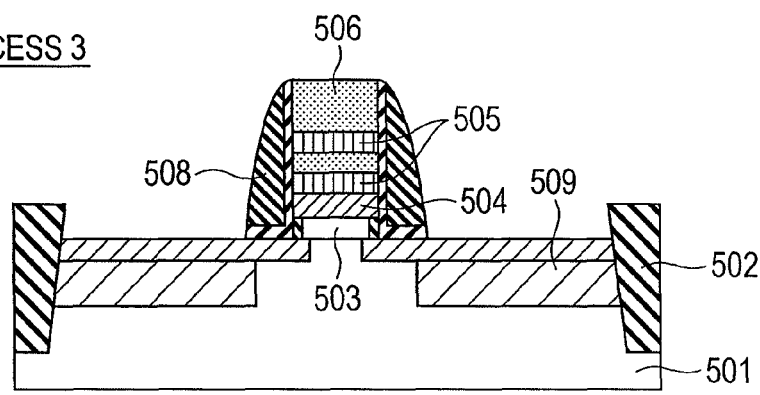

FIG. 11 is a cross-sectional view showing a fabrication process of a semiconductor element according to a second example of the present invention.

First, as shown in Step 1 of FIG. 11, a element isolation region 502 was formed on a surface of a silicon substrate 501 by the use of an STI (Shallow Trench Isolation) technique. Subsequently, a silicon oxide film was formed by a thermal oxidation method to have a thickness of 30 Å to 100 Å as a first insulating film 503 on the surface of the silicon substrate 501 having been subjected to element isolation. Then, a silicon nitride film was formed by a LPCVD (Low Pressure Chemical Vapor Deposition) to have a thickness of 30 Å to 100 Å as a second insulating film 504 on the first insulating film 503. Subsequently, an AlSiO film was formed by the same method as in the first example to have a thickness in a range of 5 nm to 20 nm as a third insulating film 505 on the second insulating film 504.

Next, after a poly-Si film having a thickness of 150 nm had been formed as a gate electrode 506, the structure fabricated in Step 1 was processed into a gate electrode by the use of the lithography technique and the RIE (Reactive Ion Etching) technique as shown in Step 2 of FIG. 11, and subsequently ion implantation was carried out to form an extension region 507 in a self-alignment manner by the use of the gate electrode as a mask.

Further, as shown in Step 3 of FIG. 11, a silicon nitride film and a silicon oxide film were deposited sequentially and, after that, a gate side wall 508 was formed by etching-back. Under the circumstances, the ion implantation was carried out again and a source-drain region 509 was formed via activation annealing treatment.

From a result of electrical characteristic evaluation of the fabricated semiconductor element, it was confirmed that the leak current was able to be reduced while the reduction of the relative permittivity was being suppressed, compared with that of the $Al_2O_3$ without containing Si, at a Si molar fraction of the AlSiO film which is the third insulating film 505, in a range of $0<Si/(Si+Al) \leq 0.1$. Further, it was confirmed that erasing characteristics and retention characteristics were improved by the formation of the AlSiO film having a Si molar fraction in the range of $0<Si/(Si+Al) \leq 0.08$.

As described above, according to the present example, it is possible to obtain a semiconductor device which can reduce a gate leak current by carrying out the dielectric film manufacturing method in the present invention to a manufacturing method of a semiconductor device having an AlSiO film as a part of a blocking insulating film in a MONOS type nonvolatile memory element.

Further, while the poly-Si film was used as the gate electrode in the present example, the same effect was also able to be obtained when TiN, TaN, W, WN, Pt, Ir, Ta, or Ti was used as the gate electrode.

Further, in the present example, while the third insulating film 505 was used as the blocking layer of the nonvolatile semiconductor memory element, the present invention is not limited to this example and the same effect was able to be obtained when the AlSiO film was included in a part of the third insulating film 505.

THIRD EXAMPLE

A third example of the present invention will be explained in detail with reference to the drawing.

Figure 12:
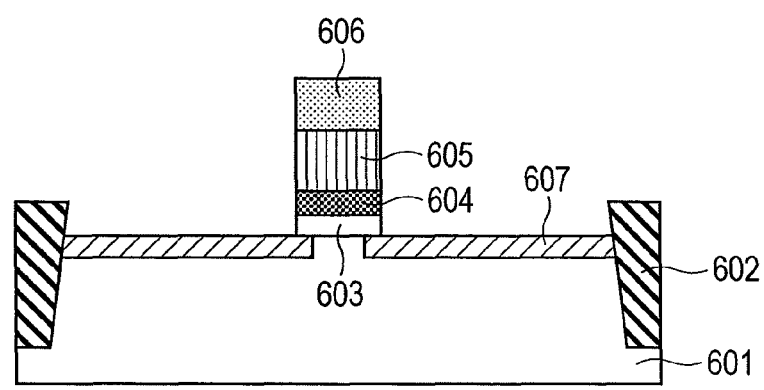
FIG. 12 is a cross-sectional view of a semiconductor device in a third example of the present invention.

FIG. 12 is a diagram showing a cross-sectional view of a semiconductor device which is the third example of the present invention. The present example is different from the second example in that the third example forms the second insulating film 504 of the second example by using a layer including poly-Si 604. The formation process of the third example is the same as that of the second example after the step for the second insulating film 504. In FIG. 12, reference numeral 601 indicates a silicon substrate, reference numeral 602 indicates an element isolation region, reference numeral 603 indicates a first insulating film, reference numeral 605 indicates a third insulating film, reference numeral 606 indicates a gate electrode, and reference numeral 607 indicates an extension region.

From a result of electric characteristic evaluation of the fabricated semiconductor device, it was confirmed that a leak current was able to be reduced compared with the $Al_2O_3$ without containing Si at a Si molar fraction of the AlSiO film, the third insulating film, in a range of $0<Si/(Si+Al)\leqq0.08$ without causing the reduction of the relative permittivity.

As described above, according to the present example, it is possible to obtain a semiconductor device which can reduce a gate leak current by applying the dielectric film manufacturing method in the present invention to a manufacturing method of a semiconductor device having an AlSiO film as a part of a blocking insulating film (inter-poly insulating film) of a FG type nonvolatile memory element having a floating electrode.

Further, in the present example, while the poly-Si film was used as the gate electrode, the same effect was also able to be obtained when TiN, TaN, W, WN, Pt, Ir, Ta, or Ti was used as the gate electrode.

Further, in the present example, while the laminated film including the third insulating film, the fourth insulating film, and the fifth insulating film was used as the blocking layer of the nonvolatile semiconductor memory element, the same effect was able to be obtained for a laminated film including only the third insulating film and the fourth insulating film.

FOURTH EXAMPLE

Example of Application to a FG Type Nonvolatile Semiconductor Element

A fourth example of the present invention will be explained in detail with reference to the drawing.

Figure 15:
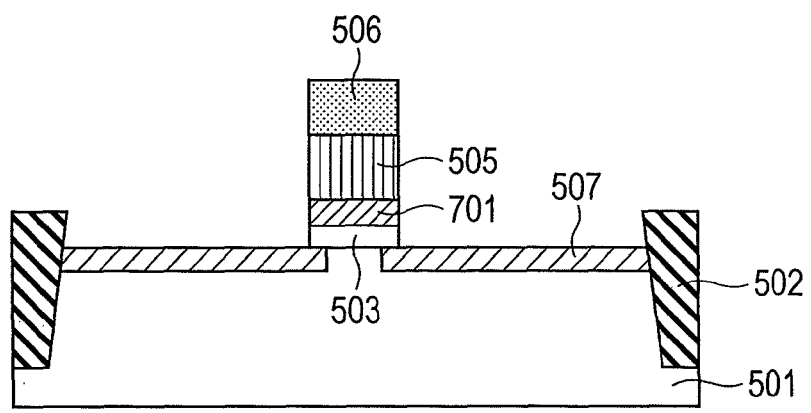
FIG. 15 is a cross-sectional view of a semiconductor device in a fourth example of the present invention.

FIG. 15 is a diagram showing a cross-sectional view of a semiconductor device which is the fourth example of the present invention. The present example is different from the second example in that the present example forms the second insulating film 504 in the semiconductor element of the second example by using a layer including poly-Si 701. The poly-Si 701 was fabricated by a CVD method. The formation process except the poly-Si layer is the same as that of the second example. While not shown in FIG. 15, it goes without saying that the FG type nonvolatile semiconductor element of the present example is provided with a source electrode and a drain electrode. Accordingly, a gate electrode is formed between the source electrode and the drain electrode on a silicon substrate 501.

From a result of electrical characteristic evaluation of the FG type nonvolatile semiconductor element which is the fabricated semiconductor device, it was confirmed that a leak current was able to be reduced compared with the $Al_2O_3$ without containing Si at a Si molar fraction of the AlSiO film, the third insulating film 505, in a range of $0<Si/(Si+Al)\leqq0.1$ without causing the reduction of the relative permittivity.

Further, it was confirmed that the erasing characteristics and the retention characteristics were improved by the formation of the AlSiO film in a Si molar fraction range of $0<Si/(Si+Al)\leqq0.08$.

As described above, according to the present example, it is possible to obtain a semiconductor device which can reduce a gate leak current and improve the erasing characteristics and the retention characteristics by applying the dielectric film manufacturing method of the present invention to a manufacturing method of a semiconductor device having an AlSiO film as a part of a blocking insulating film of a FG type nonvolatile memory element.

Further, in the present example, while the poly-Si film was used as the gate electrode, the same effect was also able to be obtained also when TiN, TaN, W, WN, Pt, Ir, Ta, or Ti was used as the gate electrode.

Further, in the present example, while the third insulating film 505 was used as the blocking layer of the FG type nonvolatile semiconductor memory element, the present invention is not limited to this example and the same effect was able to be obtained when the AlSiO film was included in a part of the third insulating film 505.

What is claimed is:

1. A dielectric film manufacturing method forming a dielectric film on a substrate, the dielectric film being a metal oxide mainly containing Al, Si, and O, the manufacturing method comprising the steps of:
   forming the metal oxide having an amorphous structure in which a molar fraction of an Al element and a Si element expressed as Si/(Si+Al) has a range of $0<Si/(Si+Al)\leqq0.10$; and
   subjecting the metal oxide having the amorphous structure to annealing treatment to form the metal oxide including a crystalline phase.

2. A dielectric film manufacturing method film according to claim 1,
   wherein the molar fraction of an Al element and a Si element expressed as Si/(Si+Al) of the metal oxide having the amorphous structure is a range of $0<Si/(Si+Al)\leqq0.08$.

3. A dielectric film manufacturing method according to claim 1,
   wherein a temperature in the annealing treatment is 1000° C. or more.

4. A dielectric film manufacturing method according to claim 1,
   Wherein the step of forming the metal oxide having the amorphous structure is a step of performing magnetron sputtering of a metal target including a metal material contained in the metal oxide layer under a mixed atmosphere of a reactive gas containing oxygen and an inert gas in a vacuum container, and
   a supply quantity of the reactive gas supplied into the vacuum container is set to be equal to or less than a supply quantity which provides a maximum lowering rate of a sputtering rate caused by oxidation of a surface of the metal target by the reactive gas, in variation of the sputtering rate of the metal target when the supply quantity of the reactive gas is increased.

5. A dielectric film manufacturing method film according to claim 4,
   Wherein the metal target includes an Al target, and the supply quantity of the reactive gas is set to be equal to or less than a supply quantity which provides a maximum lowering rate of the sputtering rate caused by oxidation of a surface of the Al target by the reactive gas.

6. A dielectric film manufacturing method according to claim 4,
wherein the metal target includes a Si target, and the supply quantity of the reactive gas is set to be equal to or less than a supply quantity which provides a maximum lowering rate of the sputtering rate caused by oxidation of a surface of the Si target by the reactive gas.

7. A dielectric film manufacturing method according to claim 4,
wherein a pressure in the vacuum container is set to $1\times10^{-1}$ Pa or less.

8. A dielectric film manufacturing method according to claim 1,
wherein a relative permittivity of the dielectric film is 8.5 or more.

9. A manufacturing method of a semiconductor device having a dielectric film as an insulating film,
Wherein
the dielectric film is formed by the manufacturing method according to claim 1.

10. A semiconductor manufacturing method of a nonvolatile semiconductor device, the nonvolatile semiconductor device comprising:
a substrate, at least a part of the surface of which includes a semiconductor layer;
a gate electrode formed on the substrate; and
a lamination type gate insulating film provided between the substrate and the gate electrode, wherein
at least one layer of insulating films included in the lamination type gate insulating film is formed by the manufacturing method according to claim 1.

11. A semiconductor manufacturing method of a nonvolatile semiconductor device, the nonvolatile semiconductor device comprising:
a substrate, at least a part of the surface of which include a semiconductor layer;
a gate electrode formed on the substrate; and
a structure in which a insulating film, a floating electrode, and an insulating film are sequentially laminated between the substrate and the gate electrode, wherein
at least a part of the insulating film located between the gate electrode and the floating electrode is formed by the manufacturing method according to claim 1.

12. A computer-readable recording medium recording a program for causing a computer to execute a formation method of a semiconductor element which includes a dielectric film having a high permittivity,
wherein the formation method is a dielectric film manufacturing method forming a dielectric film on a substrate, the dielectric film being a metal oxide mainly containing Al, Si, and O, and
the formation method comprising:
a first step of forming the metal oxide having an amorphous structure in which a molar fraction of an Al element and a Si element expressed as Si/(Si+Al) has a range of $0<Si/(Si+Al)\leqq0.10$; and
a second step of subjecting the metal oxide having the amorphous structure to annealing treatment to form the metal oxide including a crystalline phase.

13. A MIS capacitor in which a dielectric film and an upper electrode are deposited on a substrate having an oxide film on a surface thereof,
wherein the dielectric film is a metal oxide which mainly contains Al, Si, and O and includes a crystalline phase, and a molar fraction of an Al element and a Si element expressed as Si/(Si+Al) has a range of $0<Si/(Si+Al)\leqq0.10$.

14. A MONOS type nonvolatile memory element in which a source-drain region, a first insulating film, a second insulating film, a third insulating film, and a gate electrode are sequentially laminated on a substrate surface subjected to element isolation,
wherein the third insulating film is a metal oxide which mainly contains Al, Si, and O and includes a crystalline phase, and a molar fraction of an Al element and a Si element expressed as Si/(Si+Al) has a range of $0<Si/(Si+Al)\leqq0.10$.

15. A nonvolatile semiconductor device provided with a source electrode, a drain electrode, a substrate, at least a part of the surface of which is a semiconductor layer, a gate electrode formed on a region between the source electrode and the drain electrode in the substrate, and a lamination type gate insulating film provided between the substrate and the gate electrode,
wherein at least one layer of gate insulating films included in the lamination type insulating film is a blocking insulating film, and the blocking insulating film is a metal oxide which mainly contains Al, Si, and O and includes a crystalline phase, and a molar fraction of an Al element and a Si element expressed as Si/(Si+Al) has a range of $0<Si/(Si+Al)\leqq0.10$.

* * * * *